(12) United States Patent
Jaenker

(10) Patent No.: US 6,340,858 B1
(45) Date of Patent: Jan. 22, 2002

(54) METHOD FOR CALIBRATING A PIEZOELECTRIC ACTUATING DRIVE

(75) Inventor: Peter Jaenker, Garching (DE)

(73) Assignee: DaimlerChrysler AG (DE)

( * ) Notice: Subject to any disclaimer, the term of this patent is extended or adjusted under 35 U.S.C. 154(b) by 0 days.

(21) Appl. No.: 09/490,188

(22) Filed: Jan. 24, 2000

(30) Foreign Application Priority Data

Jan. 22, 1999 (DE) ........................................ 199 02 413

(51) Int. Cl.$^7$ ............................................. H01L 41/04
(52) U.S. Cl. ................................ 310/328; 310/316.01
(58) Field of Search .......................... 310/316.01, 317, 310/318, 328

(56) References Cited

U.S. PATENT DOCUMENTS

| | | | | |
|---|---|---|---|---|
| 4,263,527 A | * | 4/1981 | Comstock | 310/316 |
| 5,051,646 A | * | 9/1991 | Elings et al. | 310/317 |
| 5,297,130 A | * | 3/1994 | Tagawa et al. | 310/317 |
| 5,313,451 A | * | 5/1994 | Yagi et al. | 369/126 |
| 5,384,507 A | * | 1/1995 | Takada et al. | 310/317 |
| 5,469,734 A | * | 11/1995 | Schuman | 73/105 |
| 5,557,156 A | * | 9/1996 | Elings | 310/316 |
| 5,568,003 A | * | 10/1996 | Deck | 310/316 |
| 5,990,596 A | * | 11/1999 | Kitai et al. | 310/316 |
| 6,100,623 A | * | 8/2000 | Huang et al. | 310/317 |

FOREIGN PATENT DOCUMENTS

DE 4303125 5/1994

OTHER PUBLICATIONS

"Calibration and characterization of piezoelectric elements as used in scanning tunneling microscopy", by van de Leemput et al.; Rev. Sci. Instrum. 62(4), Apr., 1991, American Institute of Physics, pp. 989 to 992.

"Subnanometer behavior of a capacitive feedback, piezoelectric displacement actuator", by Harb et al., Rev. Sci. Instrum. 63(2), Feb., 1992, American Institute of Physics, pp. 1680 to 1689.

"Accurate, repetitive, linear motion from biased piezoelectric actuators", Rev. Sci.Instrum. 66(5), May 1995, 1995 American Institute of Physics, pp. 3204 to 3207.

Tamer et al. Feedback Control of Piezoelectric Tube Scanners. Proceedings of the 33rd Conference on Decision and Control. Dec. 1994.*

* cited by examiner

Primary Examiner—Nestor Ramirez
Assistant Examiner—Peter Medley

(57) ABSTRACT

A piezoelectric actuating drive is calibrated so that displacements or movements of its actuator output beam (4) become independent of environmental operating conditions and of piezoelectric instabilities. For this purpose an automatic determination and correlating of energizing signal values and respective displacement positions of an actuator beam (4) are performed on the basis of first sensing or measuring striking times ($t_1$, $t_2$) when the actuator beam (4) encounters at least one, preferably two limit stops which limit the beam displacement caused by piezoelectric action. The change of the electric capacitance of a piezostack (3) that displaces the actuator output beam (4) is measured when the beam (4) strikes a limit stop. Instead of measuring a change in the electric capacitance of the piezostack (3), electric charge impulses may be measured at the time ($t_1$, $t_2$) and evaluated for the correlation between the energizing control or input signal and the corresponding output beam displacement. The correlation or calibration is performed automatically by an electronic signal processing circuit when such calibration is desired in response to an operator input or it is performed automatically in response to a control program stored in a memory of the electronic signal processing circuit.

12 Claims, 2 Drawing Sheets

METHOD FOR CALIBRATING A PIEZOELECTRIC ACTUATING DRIVE

This application is based on and claims the priority under 35 U.S.C. §119 of German Patent Application 199 02 413.8, filed on Jan. 22, 1999, the entire disclosure of which is incorporated herein by reference.

FIELD OF THE INVENTION

The invention concerns a method for calibrating a piezoelectric actuating drive which includes an electronic circuit for energizing a stack of piezoelectric elements which perform a displacement according to the piezoelectric effect in response to an energizing signal.

BACKGROUND INFORMATION

A piezoelectric actuating drive is known from German Patent Publication DE-AS 43 03 125 comprising control electronics and a piezoelectric actuator. The known drive includes a circuit arrangement which improves the correlation of the piezoelectric positioning movement or displacement with the electric voltage of an energizing signal applied to a piezoelectric member. The conventional correlation wants to make sure that particularly influences on the piezoelectric displacement due to hysteresis are reduced. For this purpose a second actuating drive is provided, the output signal of which is linearly linked or coordinated with the positioning movement or displacement of the first actuating drive.

The precise stroke resolution or transformation (stroke as a function of signal size) of stroke or displacement causing piezoelectric actuating drives is impaired if environmental operating conditions change for such drives. Such changes may involve the temperature, the mechanical load, and/or instability effects of the piezoelectric ceramic member due to aging. This applies to controlled open loop systems and regulated closed loop systems with a feedback of a displacement representing signal. A precise functioning of the actuating drives is of considerable technical and economic relevance, for example in connection with piezoelectrically controlled valves of high precision, in particular for fuel injection valves in automotive engineering.

OBJECTS OF THE INVENTION

In view of the foregoing it is the aim of the invention to achieve the following objects singly or in combination:

- to provide a piezoelectric actuating drive having a positioning movement or displacement which does not depend on environmental operating conditions and not on piezoelectric instabilities without requiring an auxiliary drive;
- to calibrate the displacement of a stack of piezoelectric elements caused by an expansion or contraction of the stack, so that the displacement corresponds accurately to the energizing control signal applied to the stack; and
- to base such calibration on a response characteristic of the piezoelectric stack such as the electric capacitance or the electric charge impulse or a similar characteristic that is measurable when the displacement encounters a stop.

SUMMARY OF THE INVENTION

According to the invention the aforementioned objects have been achieved by a process for self-calibration of a piezoelectric actuating drive, advantageously using the piezoelectric effect. This calibration can be performed as required or as an automatic cyclic operation. Without requiring any additional components, the method according to the invention can be carried out with a conventional actuating drive comprising an electronic control circuit, an actuator and at least one preferably two limit stops.

The use of the piezoelectric effect according to the invention is based on the coupling of mechanical and electric properties by such an effect. A change of mechanical marginal or limiting conditions has effects that can be evaluated. One extreme condition is, for example, a locking of the piezoelectric actuator when it strikes a rigid limit stop. Another extreme condition that can be evaluated is an unhindered longitudinal displacement of the actuator. These conditions have an electric effect in such a way that, in the case of locking, the electric capacitance $C_B$ of the piezostack of the actuator is less than the electric capacitance $C_F$ in the case in which the piezostack can expand or contract unhindered. For the aforementioned condition the relation $C_B = C_F (1-k^2)$ is valid whereby k is a material parameter, also called coupling coefficient typically having a value of 0.65. Between these two extreme conditions the electric capacitance of the piezostack continually changes according to the degree of motion inhibition exerted on the piezostack.

The calibration method of the invention comprises the following steps:

a) positioning a piezoelectric actuator so that a piezoelectric displacement caused by an expansion or contraction of the piezoelectric actuator encounters at least one stop, b) applying an energizing control signal to said piezoelectric actuator or a stack of piezoelectric elements forming part of the actuator, for causing piezoelectric displacement, c) measuring a characteristic of said piezoelectric actuator and measuring at least one point of time ($t_1$, $t_2$) when said displacement is stopped by said at least one stop at one end of said displacement, (d) evaluating said energizing control signal and said characteristic of said piezoelectric actuator for determining a correlation between said energizing control signal and respective displaced positions of said piezoelectric actuator, and (e) using said correlation for said calibrating or as a calibration.

BRIEF DESCRIPTION OF THE DRAWINGS

An embodiment of the invention is described in more detail below with reference to the accompanying drawings, wherein.

DETAILED DESCRIPTION OF PREFERRED EXAMPLE EMBODIMENTS AND OF THE BEST MODE OF THE INVENTION

Figure 1:
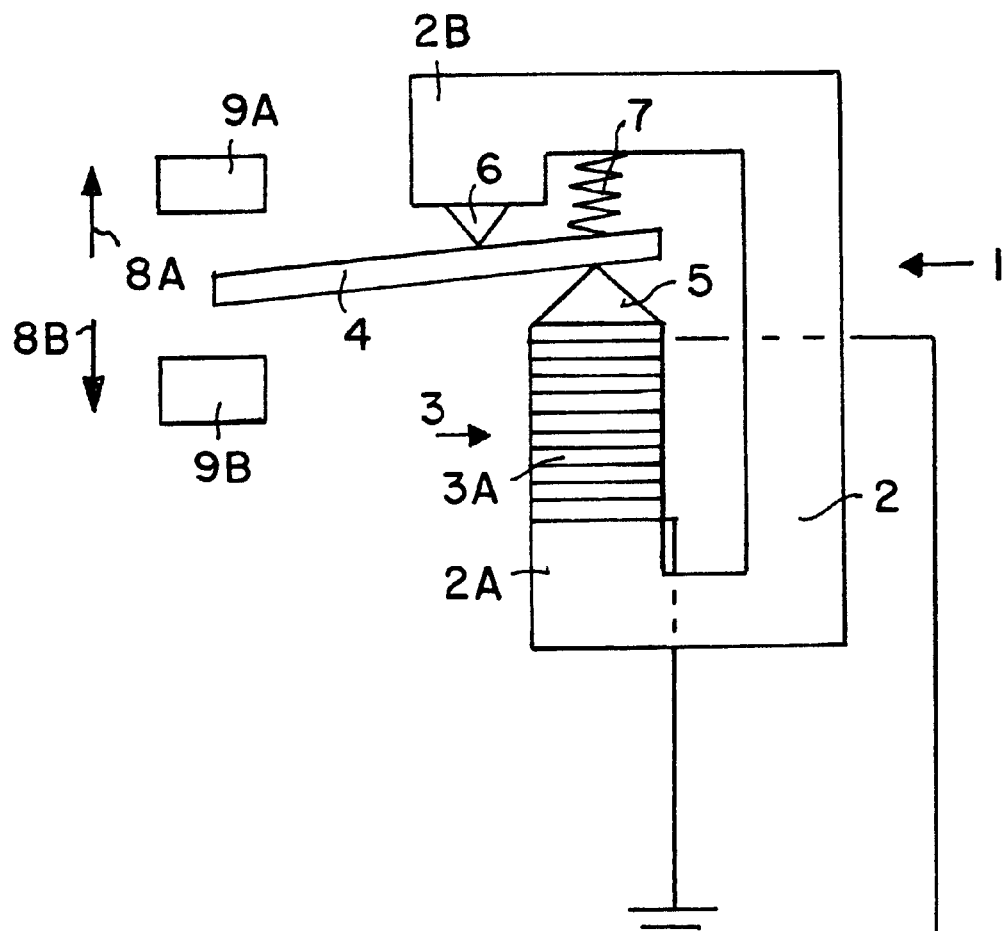
FIG. 1 shows a piezoelectric actuator with two limit stops including an energizing and signal evaluating circuit for the actuator.
Figure 1:
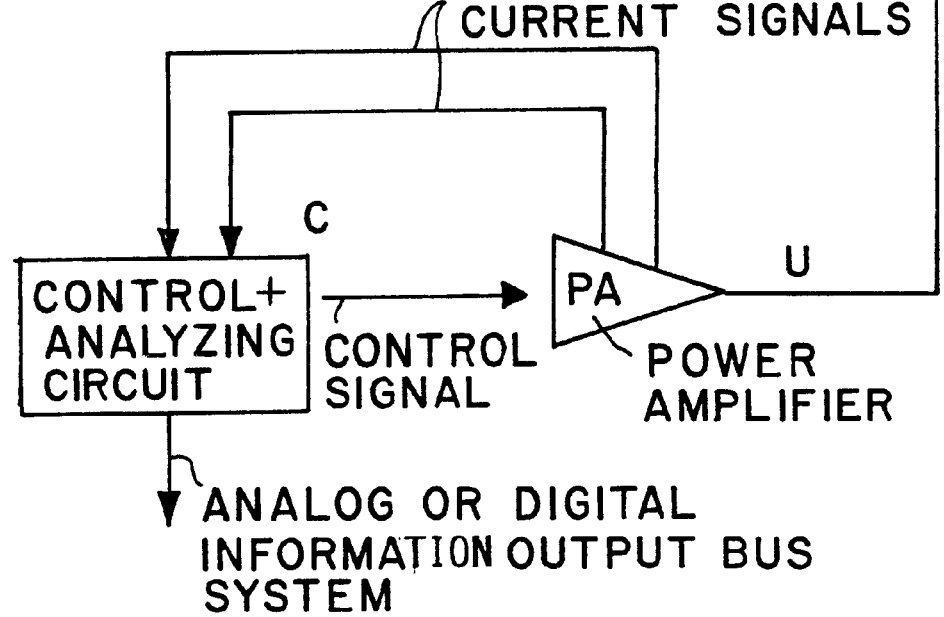

The piezoelectric actuator 1, as shown in FIG. 1, comprises a carrier frame 2, a stack 3 of piezoelectric elements 3A and an actuator output 4 formed as a beam. The stack 3 is secured with one end to a support 2A formed by the frame 2. The actuator output beam 4 is hinged between a free end 5 of the piezostack 3 and a knife-edge bearing 6. This bearing 6 is formed in a frame extension 2B laterally displaced relative to the free end 5. The output beam 4 is held against the bearing 6 and against the free end 5, preferably also formed as an edge, by a pressure spring 7. The knife-edge bearing 6 is fixed rigidly in the carrier frame.

The stack 3 of piezoelectric elements 3A is energized by an energizing signal U provided by a power amplifier PA under the control of a control and analyzing circuit C which receives feedback signals from the amplifier PA and provides respective control signals to the amplifier PA. The circuit C also provides digital or analog output signals for further use. A longitudinal deformation or change in length of the piezostack 3 by expansion or contraction leads to a controlled displacement of the actuator output 4 as a function of the energizing voltage U. When the piezostack 3 contracts or shortens the output beam 4 is tilted clockwise as indicated by the arrow 8A. A first stop 9A limits this clockwise motion or tilting. When the piezostack 3 expands or lengthens, the output beam 4 is tilted counterclockwise as indicated by the arrow 8B. A second stop 9B limits this counterclockwise motion or tilting. The two rigid limit stops 9A and 9B are mounted in a housing not shown.

The present method is not limited in its application to a piezoelectric actuator of the above described embodiment. The method according to the invention can be carried out with actuators having different configurations which are known in the art such as bending configurations, piezostack-actuators with a hydraulic or a mechanical displacement transmission, and similar piezoactuators. Furthermore, the method according to the invention can be practiced with an actuator cooperating with only one stop, as described below.

Figure 2:
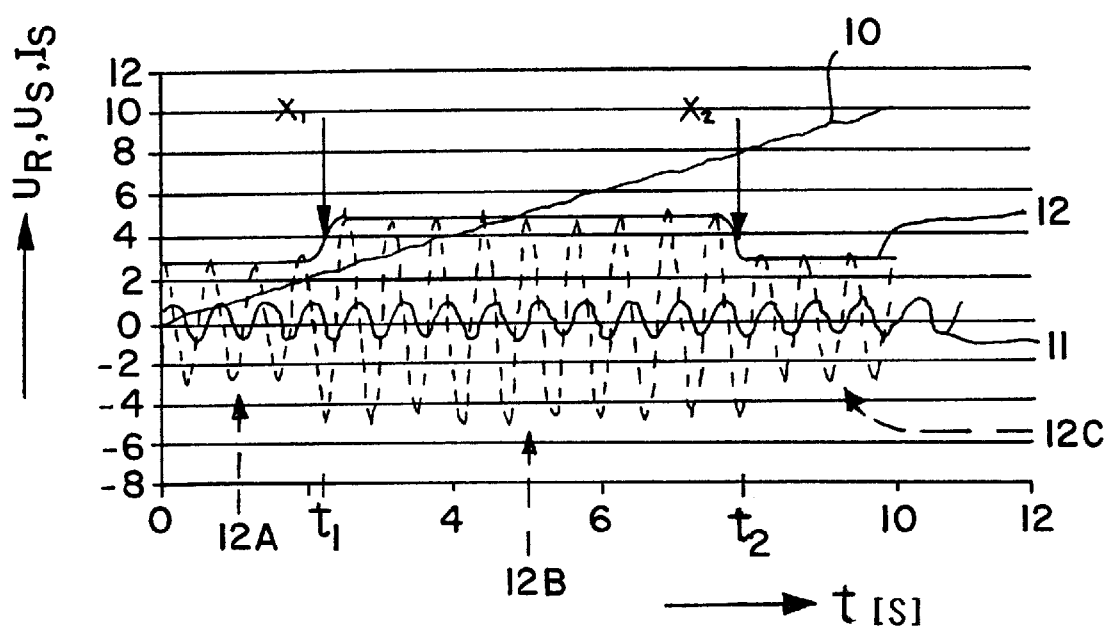
FIG. 2 shows waveforms as a function of time for an automatic calibration according to the invention of the actuator of FIG. 1.

The method according to the invention is described with reference to the signal waveforms shown in FIG. 2, as follows. In FIG. 2 the dimension of the ordinate may be either a voltage or a current. The abscissa shows time for example in seconds. In the example embodiment the piezostack 3 is energized by an energizing control signal in the form of an electric voltage U as a physical actuating control value or variable. Instead of the electric voltage U, an electric charge Q can be used as a physical actuating value or variable, as will be described below. With the electric charge Q as an actuating or energizing control signal, any dielectric hysteresis effects occurring in piezoelectric elements can be avoided. A further alternative for the present method involves measuring and evaluating charge impulses occurring when the limit stops 9A, 9B terminate any further displacement of the actuator beam 4. Both alternatives for evaluating the electric charges 1, as compared to the evaluation of an energizing voltage U, are also described below.

In the example wherein the piezostack 3 is driven or energized by an electric voltage, such energizing voltage signal U is generated as a ramp signal 10. According to the invention a high-frequency, sinusoidal voltage signal $U_s(t)$ is superimposed on this ramp signal 10. The high-frequency signal is shown as waveform 11 in FIG. 2 and satisfies the following functional interrelationship:

$$U_s(t) = U_0 \sin(\omega t)$$

wherein $U_0 \ll$ maximum of $U_R$ and $1/\omega \ll$ build-up or rise time of $U_R$, wherein $U_R$ is the rising voltage applied to the piezostack 3. A waveform of an electric current as a function of time through the actuator driven by the electric voltage U is measured. The measured signal is shown as a dashed line sinusoidal curve having three sections 12A, 12B and 12C.

The measured signal is filtered in a band-pass filter having a narrow band width centered relative to the measuring frequency $\omega$, whereby the measured signal provides a resultant measured signal 12 of the electric current $I_s$ satisfying the following equation.

$$I_s(t) = \omega C(t) U_0$$

wherein $C(t)$ is the variable electric capacitance of the piezoelectric stack 3 caused by the mechanical degrees of freedom which change due to the stops 9A, 9B when the actuator is energized as a function of time. The resultant signal 12 shows a rising flank representing a first displacement stopping position $X_1$ at time t1 and a falling flank representing a second displacement stopping position $X_2$ at time $t_2$.

When the free end of the beam 4 of the actuator 1 strikes one of the limit stops 9A or 9B at the time $t_1$, the recorded or measured current $I_s(t)$ is reduced, because the electric capacitance $C(t)$ of the piezostack 3 diminishes in the case of locking or full stop compared to a braking action imposed on the displacement of the stack 3, due to the piezoelectric effect, as described above.

According to the invention, the displacement stopping position x1 of the first limit stop 9A is detected through the rising flank in the measured signal 12 at the measured time $t_1$. This detection can be done by determining the change of the amplitude of the measured current by means of a comparator circuit or another appropriate evaluation method.

For the calibrating, the energizing control signal value $U_1 = U_R(t_1)$ is allocated to the detected displacement stopping position x1 of the first stop 9A at the determined time $t_1$. The falling flank in the measured signal 12 occurs at the second stop 9B at the time $t_2$. The energizing control signal value $U_2 = U_R(t_2)$ is allocated to the displacement stopping position x2 detected at the measured time $t_2$, when the second stop 9B is struck.

In order to calibrate displacement positions of the actuator beam 4 between the stops 9A and 9B, as a function of the applied energizing voltage (U), the physical function x(U) can be interpolated mathematically. In the simplest case the function x(U) is linear so that a linear interpolation is possible.

If the piezostack 3 is driven or energized by the electric charge Q, the energizing control signal is a low-frequency, sinusoidal waveform. A high frequency component $$Q_s(t) = Q_0 \sin(\omega t)$$

of the electric charge Q is superimposed on the charge waveform. If the electric capacitance of the piezostack changes due to the mechanical operating conditions of the piezostack 3, such as free movement or a locked status imposed by the stops 9A, 9B, then the electric voltage changes across the piezoactuator stack 3. The electric voltage of the waveform of the energizing control signal is filtered by an electronic band-pass filter for the measuring frequency $\omega$, according to the above described modification of an embodiment according to the invention. Thus filtered, the respective signal serves as a measured signal satisfying the following equation:

$$U_s(t) = Q_0 C(t) \sin(\omega t)$$

for determining the jump times $t_1$ and $t_2$ occurring at the stops 9A, 9B. These times $t_1$, $t_2$ allow the detection of the positions x1 and x2 and the corresponding actuating variables or values $Q_1 = Q_s(t_1)$ and $Q_2 = Q_s(t_2)$ can be derived and used for calibration.

If, deviating from the above described embodiments, only one limit stop is used for achieving the purpose of the invention, an interpolation for calibrating the intermediate positions becomes impossible, but an extrapolating operation can provide a considerable improvement in the positioning accuracy of the beam 4 when the stack 3 is energized and the beam 4 stops at intermediate positions and at the uncontrolled end position. For this purpose, according to the above described method, using the electric potential U or the electric charge Q, the single stop, which has to be controlled, is detected as a respective physical energizing control signal, and is then used for a zero offset compensation in the electric energizing of the actuator for its displacement control.

The stop recognition can also be accomplished by evaluating charge impulses. If the voltage-controlled or charge-controlled actuator or rather its beam is dynamically displaced between its both stop positions, an electric charge impulse is detectable when the beam 4 strikes the limit stops 9A, 9B, due to the sudden force influence on the piezostack 3. The striking times $t_1$ and $t_2$ can be determined by correlating the charge impulses with the timewise well defined electric energizing control signal. As in the previously described methods, the calibration takes place by a detection of the stopping positions x1 and x2 and a derivation of the respective control function or energizing control signal values $U_1$ and $U_2$ or with a charge control $Q_1$ and $Q_2$.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A method for automatically calibrating a piezoelectric actuator, said method comprising the following steps:
    (a) positioning said piezoelectric actuator so that a displacement caused by an expansion or contraction of said piezoelectric actuator encounters at least one stop,
    (b) applying an energizing control signal to said piezoelectric actuator for causing said piezoelectric actuator displacement,
    (c) measuring a characteristic of said piezoelectric actuator and measuring at least one point of time ($t_1$, $t_2$) when said displacement is stopped by said at least one stop at one end of said displacement,
    (d) evaluating said energizing control signal and said characteristic of said piezoelectric actuator for determining a correlation between said energizing control signal and respective displaced positions of said piezoelectric actuator, and
    (e) using said correlation for said calibrating or as a calibration.

2. The method of claim 1, further comprising measuring an electric capacitance of said piezoelectric actuator as said characteristic at said at least one point of time.

3. The method of claim 1, further comprising the following steps:
    (g) generating a voltage signal (UR) having a ramp function (10),
    (h) generating a high-frequency sinusoidal voltage signal (US(t)), having a frequency ($\omega$),
    (i) superimposing said high-frequency sinusoidal voltage signal (US(t)) on said ramp function to produce said energizing control signal,
    (j) energizing said piezoelectric actuator ($_F$) with said energizing control signal to cause a current flow (IS(t)) through said piezoelectric actuator,
    (k) filtering said current flow (IS(t)) with reference to said frequency ($\omega$) to produce a measured signal (12), and
    (l) evaluating said measured signal (12) for ascertaining said at least one point of time ($t_1$, $t_2$) for said calibrating.

4. The method of claim 1, further comprising the following steps:
    (g1) generating an electric charge (Q) having a low frequency sinusoidal waveform,
    (h1) generating a high frequency sinusoidal charge signal (QS(t)) having a high frequency ($\omega$),
    (i1) superimposing said high frequency charge signal (QS(t)) on said low frequency charge signal to produce said energizing signal,
    (j1) energizing said piezoelectric actuator with said energizing signal to cause a voltage drop (US(t)) across said piezoelectric actuator,
    (k1) filtering said voltage drop (US(t)) with reference to said frequency ($\omega$) to produce a measured signal (12), and
    (l1) evaluating said measured signal (12) for ascertaining said at least one point of time for said calibrating.

5. The method of claim 1, further comprising the following steps:
    (m) positioning two stops opposite each other for limiting a displacement range for said piezoelectric actuator,
    (n) first calibrating two stop positions (x1, x2) defined by said two stops, and then
    (o) calibrating positions between said stop positions by performing a mathematical interpolation in accordance with a known control function x(U) or x(Q), wherein x is the displacement of the piezoelectric actuator, U is the voltage of said energizing signal, and Q is the charge of said energizing signal.

6. The method of claim 1, comprising stopping said displacement of said piezoelectric actuator with said at least one stop, calibrating said displacement at said one stop to provide a calibrated stop position, performing an extrapolation signal processing thereby using said calibrated stop position for a zero offset correction in said extrapolation for improving an energizing accuracy for displacements other than a displacement causing said calibrated stop position of said piezoelectric actuator.

7. The method of claim 1, further comprising measuring at least one electric charge impulse as said characteristic of said piezoelectric actuator, said charge impulse occurring when said piezoelectric actuator is stopped by said at least one stop to provide said characteristic at said at least one point of time.

8. The method of claim 7, wherein said step of measuring said at least one point of time ($t_1$, $t_2$) is performed by defining a reference point of time when said energizing control signal is applied, and then correlating said at least one electric charge impulse to said energizing control signal.

9. The method of claim 1, wherein said calibration is performed as required in response to an operator control signal.

10. The method of claim 1, wherein said calibration is performed automatically at predetermined cycles under the control of a respective calibration program stored in a computer memory.

11. A method for calibrating a piezoelectric actuating drive comprising control electronics, a piezoelectric actuator including a piezostack and at least one limit stop, said method comprising the following steps: performing an automatic detection of control variables and respective regulated positions by measuring, with said control electronics, a change of an electric capacitance of said piezostack (3) when an actuator output (4) strikes said at least one limit stop or stops (9), and determining a striking time or times ($t_1$, $t_2$) when said at least one limit stop is struck or limit stops (9) are struck.

12. A method for calibrating a piezoelectric actuating drive comprising control electronics, a piezoelectric actuator including a piezoelectric stack and at least one limit stop, said method comprising the following steps: performing an automatic detection of control variables and respective regulated positions by measuring, with said control electronics, the occurrence of electric charge impulses at said piezostack (3) of the actuator (1) when an actuator output (4) strikes said limit stop or stops (9) and determining the striking time or times ($t_1$, $t_2$) when said at least one limit stop is struck or when limit stops (9) are struck.

* * * * *

UNITED STATES PATENT AND TRADEMARK OFFICE
CERTIFICATE OF CORRECTION

PATENT NO. : 6,340,858 B1 Page 1 of 1
DATED : January 22, 2002
INVENTOR(S) : Jaenker It is certified that error appears in the above-identified patent and that said Letters Patent is hereby corrected as shown below:

<u>Title page,</u>
Item [73], Assignee, after "DaimlerChrysler AG", insert --, Stuttgart, --.
Following "Assistant Examiner - Peter Medley", and above,
Item [57], insert: -- *Attorney, Agent, or Firm* - W. F. Fasse, W. G. Fasse --.

<u>Column 1,</u>
Line 31, after "precise", replace "stroke resolution of transformation (stroke as" by -- function of --;
Line 32, before "displacement", delete "a function of signal size) of stroke or".

Signed and Sealed this

Twentieth Day of August, 2002

*Attest:*

JAMES E. ROGAN
*Attesting Officer* *Director of the United States Patent and Trademark Office*